(12) United States Patent
Ode

(10) Patent No.: US 8,912,628 B2
(45) Date of Patent: Dec. 16, 2014

(54) SEMICONDUCTOR DEVICE AND METHOD FOR MANUFACTURING THE SAME

(71) Applicant: Elpida Memory, Inc., Tokyo (JP)

(72) Inventor: Hiroyuki Ode, Tokyo (JP)

(73) Assignee: PS4 Luxco S.A.R.L., Luxembourg (LU)

(*) Notice: Subject to any disclaimer, the term of this patent is extended or adjusted under 35 U.S.C. 154(b) by 0 days.

(21) Appl. No.: 13/672,169

(22) Filed: Nov. 8, 2012

(65) Prior Publication Data
US 2013/0147013 A1 Jun. 13, 2013

(30) Foreign Application Priority Data

Dec. 7, 2011 (JP) ................................. 2011-267690

(51) Int. Cl.
*H01L 27/08* (2006.01)

(52) U.S. Cl.
USPC ...................... 257/531; 257/751; 257/E23.01

(58) Field of Classification Search
USPC .................................... 257/531, 751, E23.01
See application file for complete search history.

(56) References Cited

U.S. PATENT DOCUMENTS

| | | | |
|---|---|---|---|
| 2007/0096189 A1* | 5/2007 | Iwasaki et al. | 257/306 |
| 2008/0054328 A1* | 3/2008 | Wang | 257/306 |
| 2009/0061538 A1* | 3/2009 | Heo et al. | 438/3 |
| 2010/0207246 A1* | 8/2010 | Booth et al. | 257/532 |
| 2010/0327409 A1* | 12/2010 | Kume et al. | 257/532 |
| 2012/0040162 A1* | 2/2012 | Huang et al. | 428/220 |
| 2013/0143379 A1* | 6/2013 | Malholtra et al. | 438/381 |
| 2013/0207105 A1* | 8/2013 | Miller et al. | 257/43 |

FOREIGN PATENT DOCUMENTS

| | | |
|---|---|---|
| JP | 2000-031404 | 1/2000 |
| JP | 2011-204751 | 10/2011 |

* cited by examiner

*Primary Examiner* — Victor A Mandala
(74) *Attorney, Agent, or Firm* — Young & Thompson

(57) ABSTRACT

A semiconductor device comprises a conductor film and a capacitor comprising a lower electrode provided on the conductor film. The conductor film includes a first conductive film containing a first metal, a second conductive film containing a second metal on the first conductive film, and an oxide film of the second metal on the second conductive film. The oxide film of the second metal has a lower electric resistivity than an oxide film of the first metal.

20 Claims, 13 Drawing Sheets

FIG.3
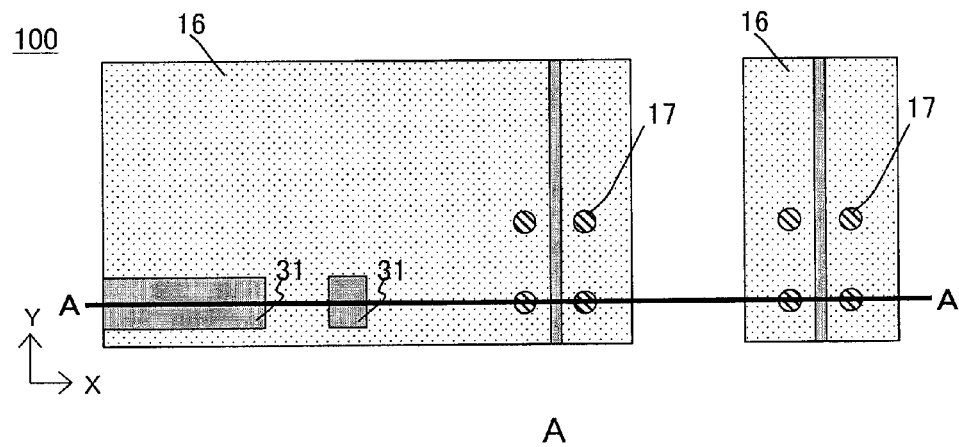
A
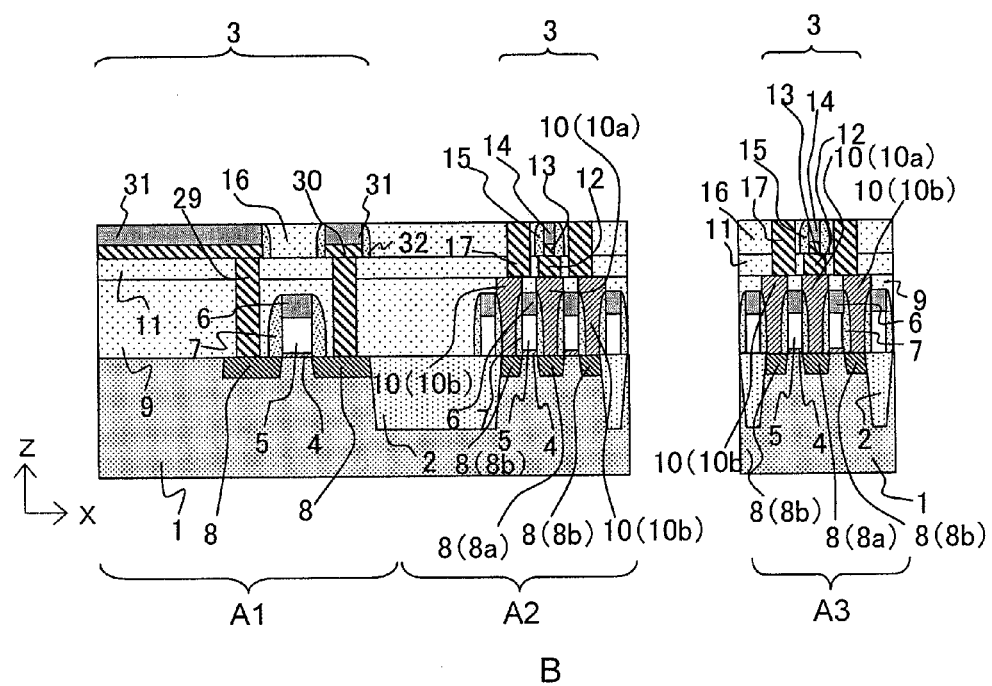
B

FIG.4
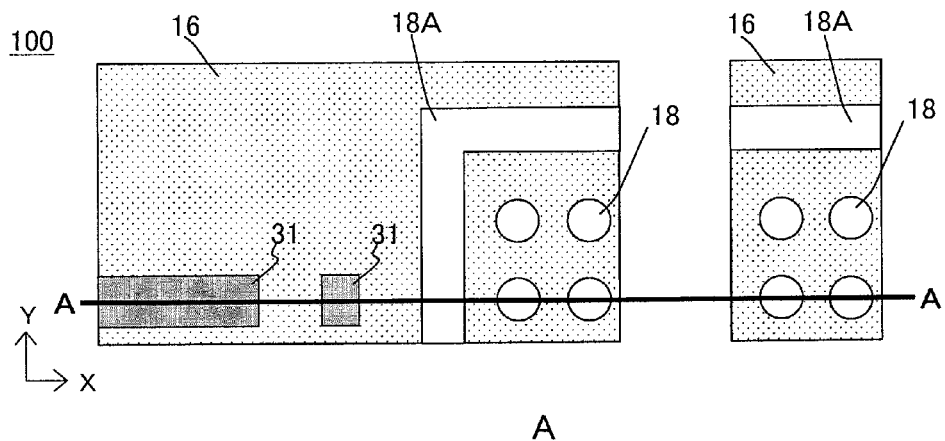
A
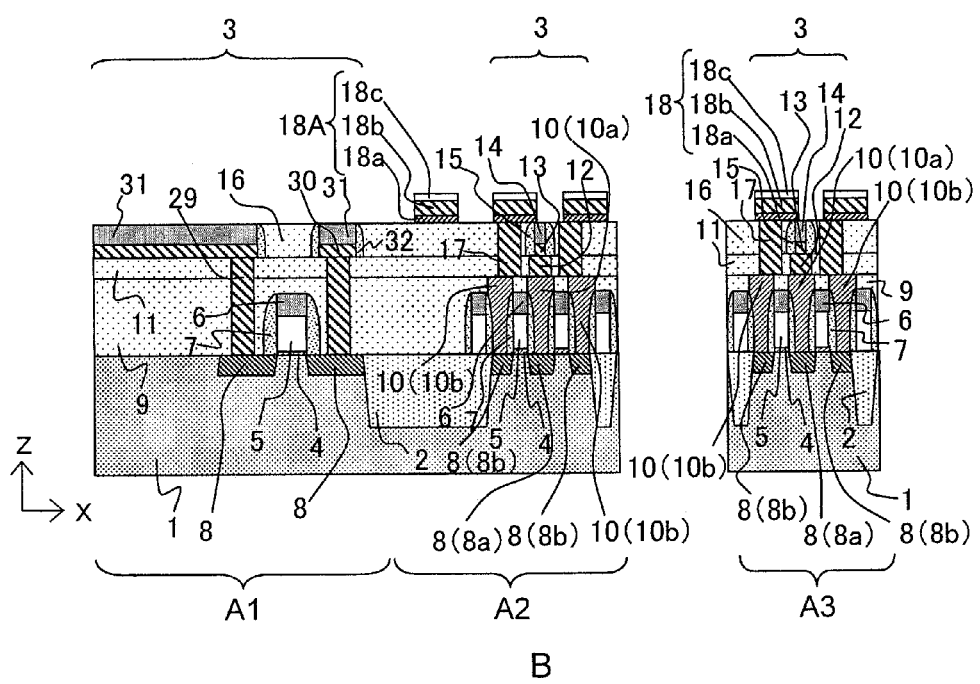
B

FIG.5
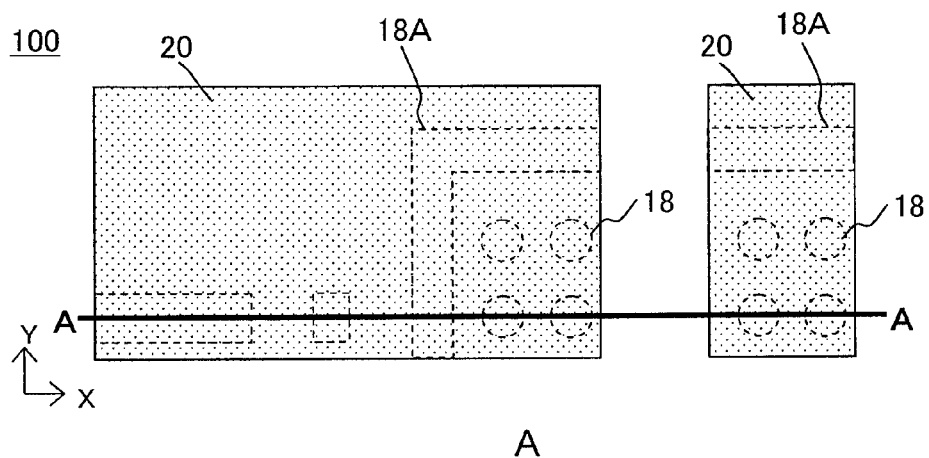
A
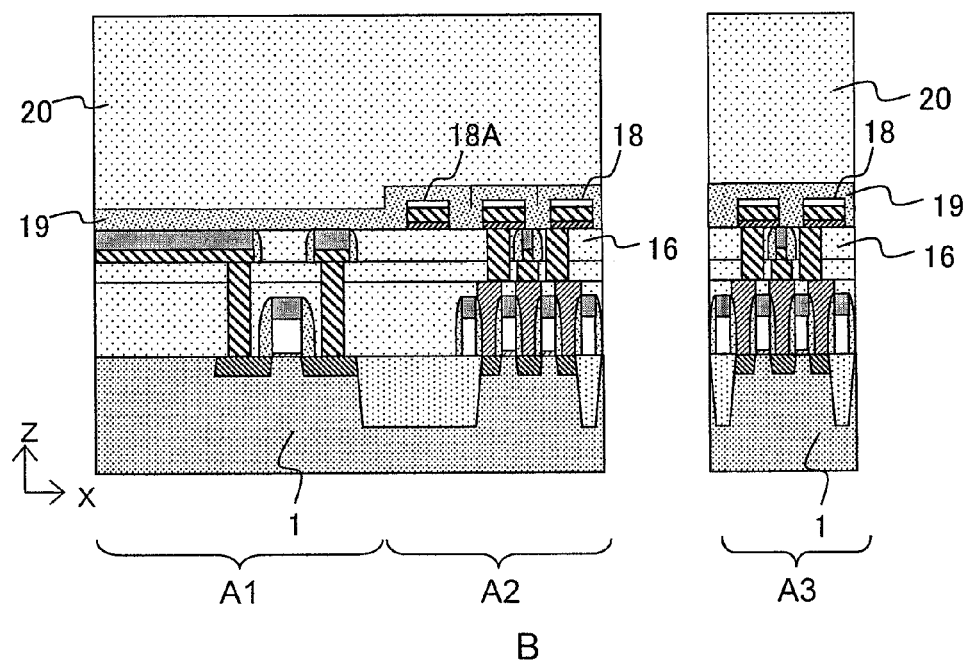
B

FIG.13
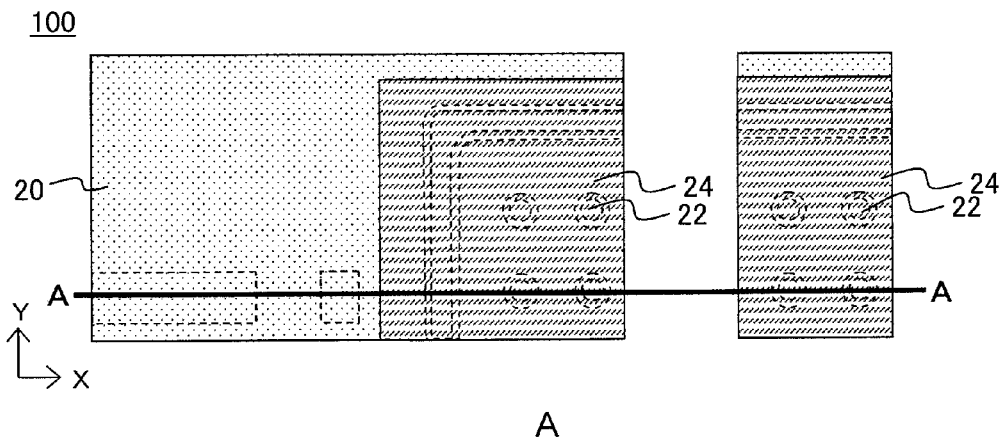
A
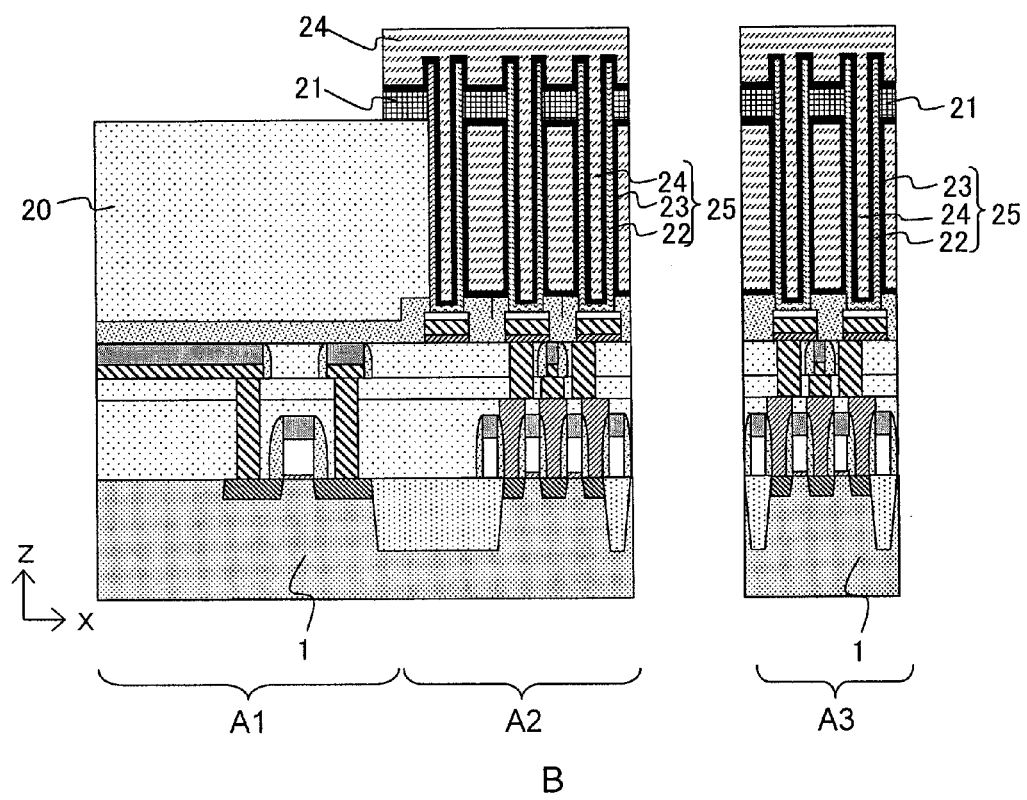
B

US 8,912,628 B2

SEMICONDUCTOR DEVICE AND METHOD FOR MANUFACTURING THE SAME

This application is based upon and claims the benefit of priority from Japanese Patent Application No. 2011-267690 filed on Dec. 7, 2011, the disclosure of which are incorporated herein in its entirety by reference.

BACKGROUND OF THE INVENTION

1. Field of the Invention

The present invention relates to a semiconductor device and a method for manufacturing the semiconductor device.

2. Description of the Related Art

DRAM (Dynamic Random Access Memories) has been used as semiconductor storage devices. The DRAM includes a plurality of memory cells each of which is formed of a transistor and a capacitor. The capacitor includes a capacitive insulating film between a lower electrode and an upper electrode. Charge is held in the capacitive insulating film to store information.

FIG. 7 and FIG. 8 in JP2011-204751A disclose forming an aluminum oxide film and a zirconium oxide film by an ALD method respectively. The ALD method forms one molecular layer of an aluminum oxide film or a zirconium oxide film by carrying out a cycle including supplying material gas, purging the material gas, supplying $O_3$ gas, and purging the $O_3$ gas. Then, the cycle is repeated a plurality of times to form an aluminum oxide film and a zirconium oxide film with respective desired film thicknesses.

JP2000-31404A discloses that a metal oxide film such as an $IrO_2$ film, an ITO film, an $RHO_2$ film, an $RuO_2$ film, or an $MoO_3$ film is used as a part of the lower electrode (Paragraph [0013]).

In the DRAM, the connection between the lower electrode of the capacitor and a capacitive contact plug positioned under the lower electrode is established via a pad in order to ensure a pitch aligning margin (hereinafter occasionally referred to as a "contact pad"). The pad needs to have reduced resistance, and thus a metal layer, particularly tungsten, is used as a common pad material. Furthermore, as a method for forming the lower electrode, there is used the ALD method, which is excellent in step coverage and which can deal with miniaturization. When a metal oxide film is formed as the lower electrode by the ALD method, as described in JP2000-31404A, $O_3$ gas, which has high oxidizability, is used to oxidize a metal material. However, the $O_3$ gas oxidizes the pad formed of tungsten or the like to increase the electric resistivity thereof, thereby inhibiting the electric continuity between the lower electrode and the pad.

SUMMARY

In one embodiment, there is provided a semiconductor device comprising:
a conductor which includes a first conductive film containing a first metal, a second conductive film containing a second metal on the first conductive film, and an oxide film of the second metal on the second conductive film; and
a capacitor comprising a lower electrode provided on the conductor,
wherein the oxide film of the second metal has a lower electric resistivity than an oxide film of the first metal.

In another embodiment, there is provided a semiconductor device comprising:
a first conductive film containing a first metal;
a second conductive film containing a second metal on the first conductive film;
an oxide film of the second metal on the second conductive film; and
a third conductive film on the oxide film of the second metal,
wherein the oxide film of the second metal has a lower electric resistivity than an oxide film of the first metal.

BRIEF DESCRIPTION OF THE DRAWINGS

The above features and advantages of the present invention will be more apparent from the following description of certain preferred embodiments taken in conjunction with the accompanying drawings, in which:

FIG. 3 illustrates a step of a method for manufacturing a semiconductor device according to the first exemplary embodiment;

FIG. 4 illustrates a step of the method for manufacturing a semiconductor device according to the first exemplary embodiment;

FIG. 5 illustrates a step of the method for manufacturing a semiconductor device according to the first exemplary embodiment;

FIG. 13 illustrates a step of the method for manufacturing a semiconductor device according to the first exemplary embodiment.

Figure 1:
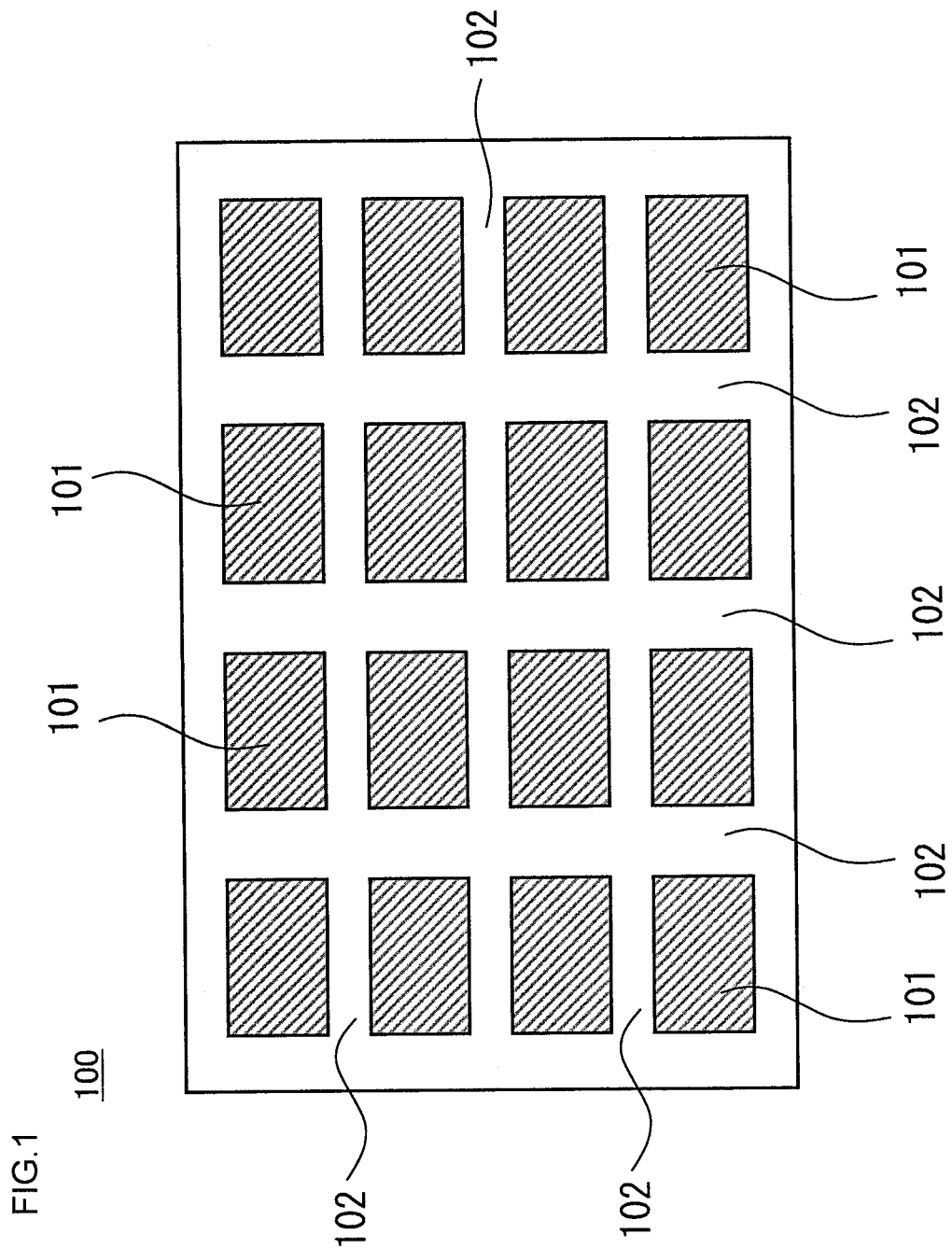
FIG. 1 illustrates a semiconductor device according to a first exemplary embodiment.

In the drawing, numerals have the following meanings. 1: semiconductor substrate (silicon substrate), 2: STI, 3: active region, 4: gate insulating film, 5: gate electrode, 6, 14, 31: insulating film, 7: sidewall insulating film, 8, 8a, 8b: diffusion layer, 9: first interlayer insulating film, 10, 10a, 10b: first contact plug, 11: second interlayer insulating film, 12: second contact plug, 13: first wiring, 15: sidewall insulating film, 16: third interlayer insulating film, 17: third contact plug, 18: contact pad, 18a: diffusion preventing film, 18b: first conductive film, 18c: sacrifice film (second conductive film), 18A: dummy pad, 19: cover film, 20: fourth interlayer insulating film, 21: support film, 21A, 21B: openings, 22: lower electrode, 22A: dummy electrode, 23: capacitive insulating film, 24: upper electrode, 25: capacitor, 26: fifth interlayer insulating film, 27: fourth contact plug, 28: second wiring, 29: fifth contact plug, 30: third wiring, 32: sidewall insulating film, 33: sixth contact plug, 35: mask film, 35A, 35B: openings, 36: cylinder hall, 36A: dummy hole, 100: semiconductor device, 101: memory cell region, 102: peripheral circuit region.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

A semiconductor device according to an exemplary embodiment will be described below in detail with reference to the attached drawings, taking a DRAM (Dynamic Random Access Memory) as an example.

FIG. 1 is a conceptual drawing showing a planar structure of a DRAM that is an example of semiconductor device 100 according to an exemplary embodiment. The DRAM as the semiconductor device according to the exemplary embodiment is generally formed of memory cell regions 101 and peripheral circuit region 102. A plurality of memory cell regions 101 are arranged on the DRAM. Peripheral circuit region 102 is arranged to surround memory cell regions 101. Peripheral circuit region 102 includes a sense amplifier circuit, a word line driving circuit, and an input/output circuit for external devices (these circuits are not shown in the drawings). In addition, the layout in FIG. 1 is illustrative, and the number and positions of memory cell regions 101 are not limited to those in the layout in FIG. 1.

Figure 2:
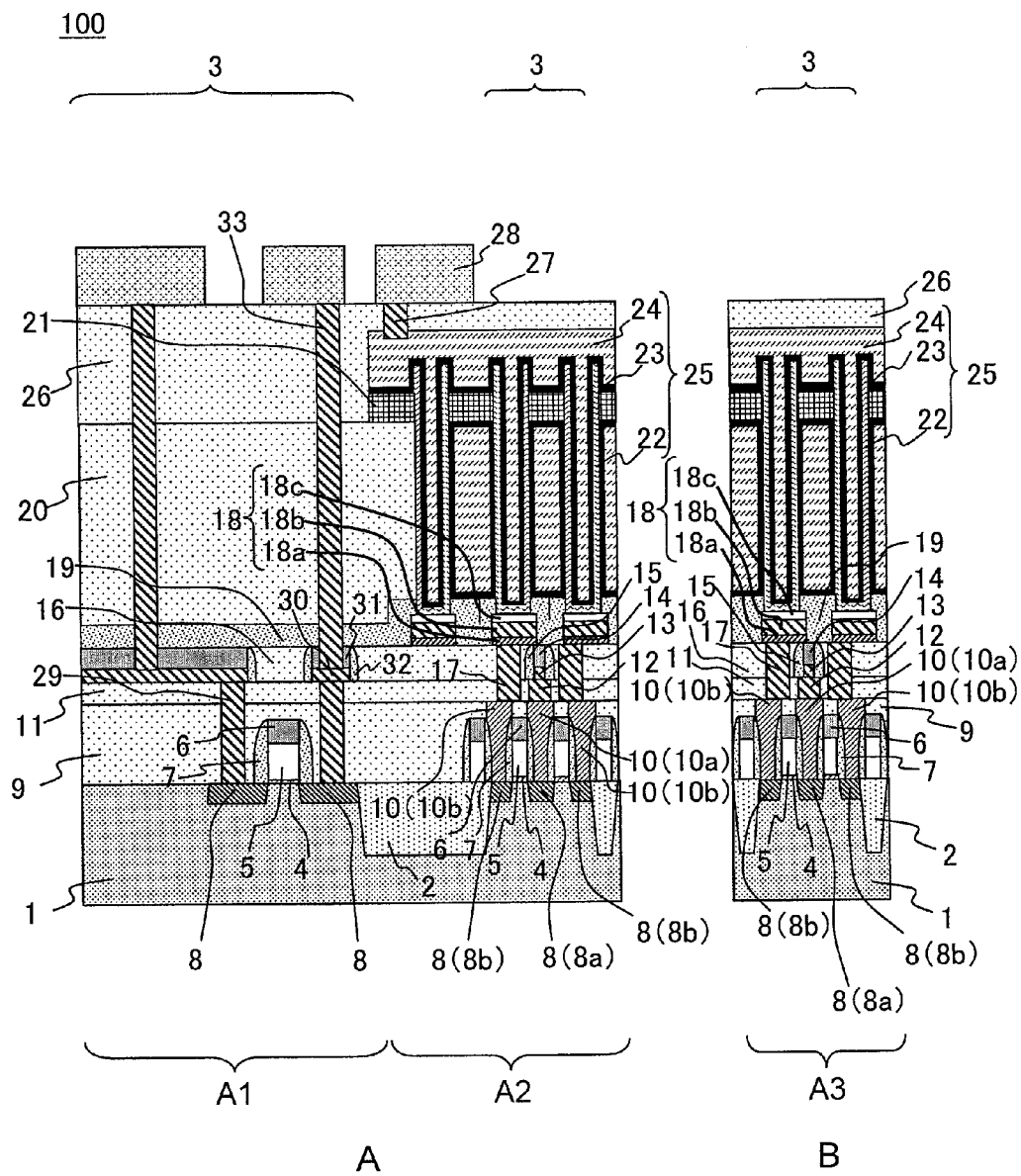
FIG. 2 illustrates the semiconductor device according to the first exemplary embodiment.

FIG. 2 is a schematic cross-sectional view showing the structure of the DRAM that is an example of semiconductor device 100 according to the exemplary embodiment. FIG. 2A shows peripheral circuit region A1 and end A2 of a memory cell region. FIG. 2B shows central portion A3 of the memory cell region. The end and central portion of the memory cell region are collectively referred to as the memory cell region.

In the DRAM according to the present exemplary embodiment, a planar MOS (Metal Oxide Semiconductor) transistor is provided on semiconductor substrate 1 (hereinafter referred to as "silicon substrate 1") in the memory cell region and in the peripheral circuit region. The planar MOS transistor is positioned in active region 3 surrounded by STI (Shallow Trench Isolation) 2 serving as an isolation region provided in silicon substrate 1. The planar MOS transistor includes gate insulating film 4 provided on a surface of silicon substrate 1, gate electrode 5 covering over gate insulating film 4, and diffusion layer 8 provided around silicon substrate 1 under gate insulating film 4 and serving as a source and a drain. Moreover, a top surface portion and a side surface portion of gate electrode 5 are covered with insulating film 6 and sidewall insulating film 7, respectively. Each of diffusion layers 8 is positioned not immediately below gate insulating film 4 but in regions of silicon substrate 1 where gate insulating film 4 is not formed thereon.

For convenience of description, two MOS transistors are shown in active region 3 in FIG. 2B. However, in actuality, several thousands to several hundred thousands of MOS transistors are arranged therein. Each of diffusion layers 8 is positioned in an upper part of silicon substrate 1, covered with first interlayer insulating film 9, and is adapted to have a conductivity type opposite to that of impurities in silicon substrate 1.

In the memory cell region, first contact plug 10 connected to each of diffusion layers 8 is provided so as to penetrate through first interlayer insulating film 9 and positioned between sidewall insulating films 7 of adjacent planar MOS transistors. Here, first contact plug 10a connected to diffusion layer 8a is connected to second contact plug 12 provided so as to penetrate through second interlayer insulating film 11. Furthermore, first contact plugs 10b connected to diffusion layer 8b are connected to respective third contact plugs 17 provided so as to penetrate through second interlayer insulating film 11 and third interlayer insulating film 16. Additionally, first wiring 13 serving as a bit line is positioned on second interlayer insulating film 11 so as to be covered with insulating film 14 and sidewall insulating film 15. First wiring 13 is connected to second contact plug 12.

Contact pads 18 are provided on third interlayer insulating film 16 so as to ensure an alignment margin between cylindrical capacitor 25 and each third contact plug 17. Each contact pad 18 is connected to corresponding third contact plug 17, positioned under contact pad 18. Here, contact pad (conductor film) 18 has a three-layer structure with diffusion preventing film 18a as a lowermost layer, first conductive film 18b as an intermediate layer, and sacrifice film (second conductive film) 18c as an uppermost layer. As described below with reference to FIG. 10, an oxide film is formed on sacrifice film 18c. However, the oxide film and the lower electrode are formed of the same oxide film, and thus the oxide film is not shown in pad 18 in FIG. 2. This also applies to the drawings subsequent to FIG. 2.

Cylindrical capacitors 25 each including lower electrode 22, capacitive insulating film 23, and upper electrode 24 are provided on respective contact pad (conductor film) 18 so as to penetrate through cover film 19 that protects fourth interlayer insulating film 20 and third interlayer insulating film 16. Lower electrode 22 is connected to each contact pad 18. Here, when the electric resistivity of contact pad 18 increases, the electrical characteristics of capacitor 25 are degraded to cause semiconductor device 100 to malfunction.

Moreover, a side surface portion of cylindrical capacitor 25 is connected to support film 21 arranged to prevent cylindrical capacitor 25 from being collapsed so that adjacent cylindrical capacitors 25 can support each other. On cylindrical capacitor 25, at an end of the memory cell region, fourth contact plug 27 connected to upper electrode 24 is provided in fifth interlayer insulating film 26 covering upper electrode 24. Fourth contact plug 27 is connected to second wiring 28 positioned on fifth interlayer insulating film 26.

In the peripheral circuit region, fifth contact plug 29 connected to diffusion layer 8 is provided to penetrate through first interlayer insulating film 9 and second interlayer insulating film 11. Furthermore, third wiring 30 is positioned on second interlayer insulating film 11 so as to be covered with insulating film 31 and sidewall insulating film 32. Third wiring 30 is connected to fifth contact plug 29. A top surface of third wiring 30 is covered with cover film 19. Moreover, fourth interlayer insulating film 20 and fifth interlayer insulating film 26 are provided on cover film 19. Sixth contact plug 33 is arranged so as to penetrate through each of fourth interlayer insulating film 20 and fifth interlayer insulating film 26. Sixth contact plug 33 connects second wiring 28 and third wiring 30 together.

In connection with the DRAM configured as described above, a method for manufacturing semiconductor device 100 according to the present invention is mainly used for steps of manufacturing contact pad 18 and capacitor 25. Thus, the manufacturing method will be described with reference to FIG. 3 to FIG. 13. In FIG. 3 to FIG. 9, FIG. 12, and FIG. 13, subfigure A is a plan view of the peripheral circuit region and the end and central portion of the memory cell region. Subfigure B is a cross-sectional view taken along line A-A in subfigure A. Furthermore, in subfigure A, components on the surface in the corresponding manufacturing step are shown by solid lines. The main components arranged below the surface are shown by dashed lines.

As shown in FIG. 3, active region 3 was formed on silicon substrate 1 by using a silicon oxide film ($SiO_2$) or a silicon nitride film (SiN) to form STI 2 serving as an isolation region. Then, gate insulating film 4, gate electrode 5, and insulating film 6 were sequentially deposited on silicon substrate 1; gate insulating film 4 that was a silicon oxide film, was formed by a thermal oxidation method, gate electrode 5 was formed by depositing polysilicon by a thermal CVD (Chemical Vapor Deposition) method or depositing tungsten (W) by a CVD method, and insulating film 6 was formed by depositing a silicon nitride film by a plasma CVD method. Then, dry etching was carried out using insulating film 6 as a mask to form gate electrode 5 of the planar MOS transistor. The side surface portion of gate electrode 5 was covered with sidewall insulating film 7 that was a silicon nitride film by a thermal CVD method.

Then, diffusion layers 8 were formed in silicon substrate 1 around gate electrode 5 by an ion injection method. Moreover, first interlayer insulating film 9 was formed so as to bury the transistor using SOD (Spin On Dielectric) that were a coating insulating material. First interlayer insulating film 9 was flattened by a CMP (Chemical Mechanical Polishing) method. Moreover, a photo resist (not shown in the drawings) was coated on first interlayer insulating film 9. A hole pattern with a desired shape was formed on a desired region of diffusion layer 8 by photolithography. Then, dry etching was carried out using the hole pattern (not shown in the drawings) as a mask to form a first hole (not shown in the drawings) in first interlayer insulating film 9.

Then, the first hole was buried using a conductive film such as polysilicon deposited by the thermal CVD method or tungsten deposited by the CVD method. Thereafter, an excess part of the conductive film on first interlayer insulating film 9 was removed by CMP to form first contact plug 10. In this case, first contact plug 10 is connected to diffusion layer 8.

Second interlayer insulating film 11 was formed on first interlayer insulating film 9 by depositing a silicon oxide film using the plasma CVD method. Then, in a manner similar to that described above, a second hole (not shown in the drawings) was formed in second interlayer insulating film 11 by photolithography and dry etching. Moreover, a conductive film such as tungsten was formed and CMP treatment was carried out to form second contact plug 12 on a part of a memory cell region in which the conductive film was buried and to form fifth contact plug 29 in the peripheral circuit region. Here, second contact plug 12 is connected to first contact plug 10, and fifth contact plug 29 is connected to diffusion layer 8.

Furthermore, tungsten (W) was deposited on second interlayer insulating film 11 by the sputter method, and a silicon nitride film was deposited on second interlayer insulating film 11 by the plasma CVD method. Then, these films were separated from one another (patterning) by photolithography and dry etching to form first wiring 13 in the memory cell region and to form third wiring 30 in the peripheral circuit region. In this case, insulating film 14 is stacked on a top surface of first wiring 13, which is connected to second contact plug 12. Insulating film 31 is stacked on the top surface of third wiring 30, which is connected to fifth contact plug 29. A side surface portion of first wiring 13 was covered with sidewall insulating film 15 such as a silicon nitride film deposited by the thermal CVD method, and at the same time, a side surface portion of third wiring 30 was covered with similar sidewall insulating film 32. Then, the respective pieces of wiring were covered with third interlayer insulating film 16 that was SOD. Thereafter, the third interlayer insulating film 16 was flattened by CMP.

Then, a photo resist (not shown in the drawings) was coated on third interlayer insulating film 16. A hole pattern (not shown in the drawings) was formed on the photo resist on desired first contact plug 10 by photolithography. Moreover, dry etching was carried out to form a third hole (not shown in the drawings) in second interlayer insulating film 11 and third interlayer insulating film 16. Then, the third hole was buried using a conductive film such as polysilicon deposited by the thermal CVD method or tungsten deposited by the CVD method. Thereafter, an excess part of the conductive film on third interlayer insulating film 16 was removed by CMP treatment to form third contact plug 17. Here, third contact plug 17 is connected to first contact plug 10.

As shown in FIG. 4, the sputter method was used to form diffusion preventing film 18a, first conductive film 18b, and sacrifice film (second conductive film) 18c so that the films 18a, 18b, and 18c cover third contact plug 17; diffusion preventing film 18a was tungsten nitride (WN) with a thickness of 10 nm, first conductive film 18b was tungsten (W) (first metal) with a thickness of 30 nm, and sacrifice film (second conductive film) 18c was molybdenum (Mo) (second metal) with a thickness of 10 nm. At this time, deposition conditions for molybdenum were as follows:

A magnetron sputter method using a molybdenum target was used. Argon (Ar) was used as process gas. For argon, flow rate and power supply AC output were set to 30 sccm (standard cubic centimeter per minute), 1,000 W, respectively, and temperature and pressure were set to 25° C. and 1.0 Pa, respectively.

Moreover, diffusion preventing film 18a, first conductive film 18b, and sacrifice film 18c were patterned to form contact pad 18 with a diameter of 100 nm by photolithography and dry etching. In this dry etching, first, sacrifice film 18c was etched, and then remaining first conductive film 18b and diffusion preventing film 18a were etched. Sacrifice film 18c was dry etched using tetrachlorosilane ($SiCl_4$), oxygen ($O_2$), and trifluoromethane ($CHF_3$) as process gas. Furthermore, dry etching conditions for first conductive film 18b and diffusion preventing film 18a were as follows:

Sulfur hexafluoride ($SF_6$), oxygen ($O_2$), and argon (Ar) were used as process gas, and the respective flow rates were set to 70 sccm ($SF_6$), 30 sccm ($O_2$), and 120 sccm (Ar). Source power was set to 600 W to 1,200 W, bias power was set to 50 W to 200 W, and pressure was set to 4 mTorr to 20 mTorr.

Here, diffusion preventing film 18a forming contact pad 18 is connected to third contact plug 17.

Moreover, here, simultaneously with the formation of contact pad 18, dummy pad 18A was formed so as to surround contact pad 18. Like contact pad 18, dummy pad 18A is formed of diffusion preventing film 18a, first conductive film 18b, and sacrifice film (second conductive film) 18c. In this case, molybdenum is used as a second metal forming sacrifice film 18c. However, metal such as cobalt (Co), ruthenium (Ru), chromium (Cr), or manganese (Mn) may be used as a second metal instead of molybdenum.

As shown in FIG. 5, as a protective film for third interlayer insulating film 16 used during wet etching of fourth interlayer insulating film 20 described below, cover film 19 was deposited so as to cover contact pad 18, dummy pad 18A, and third interlayer insulating film 16. Here, cover film 19 may be a silicon nitride film of thickness 50 nm deposited by the thermal CVD method. Then, fourth interlayer insulating film 20 that was a silicon oxide film of thickness 1,600 nm was deposited on cover film 19 by the plasma CVD method.

Figure 6:
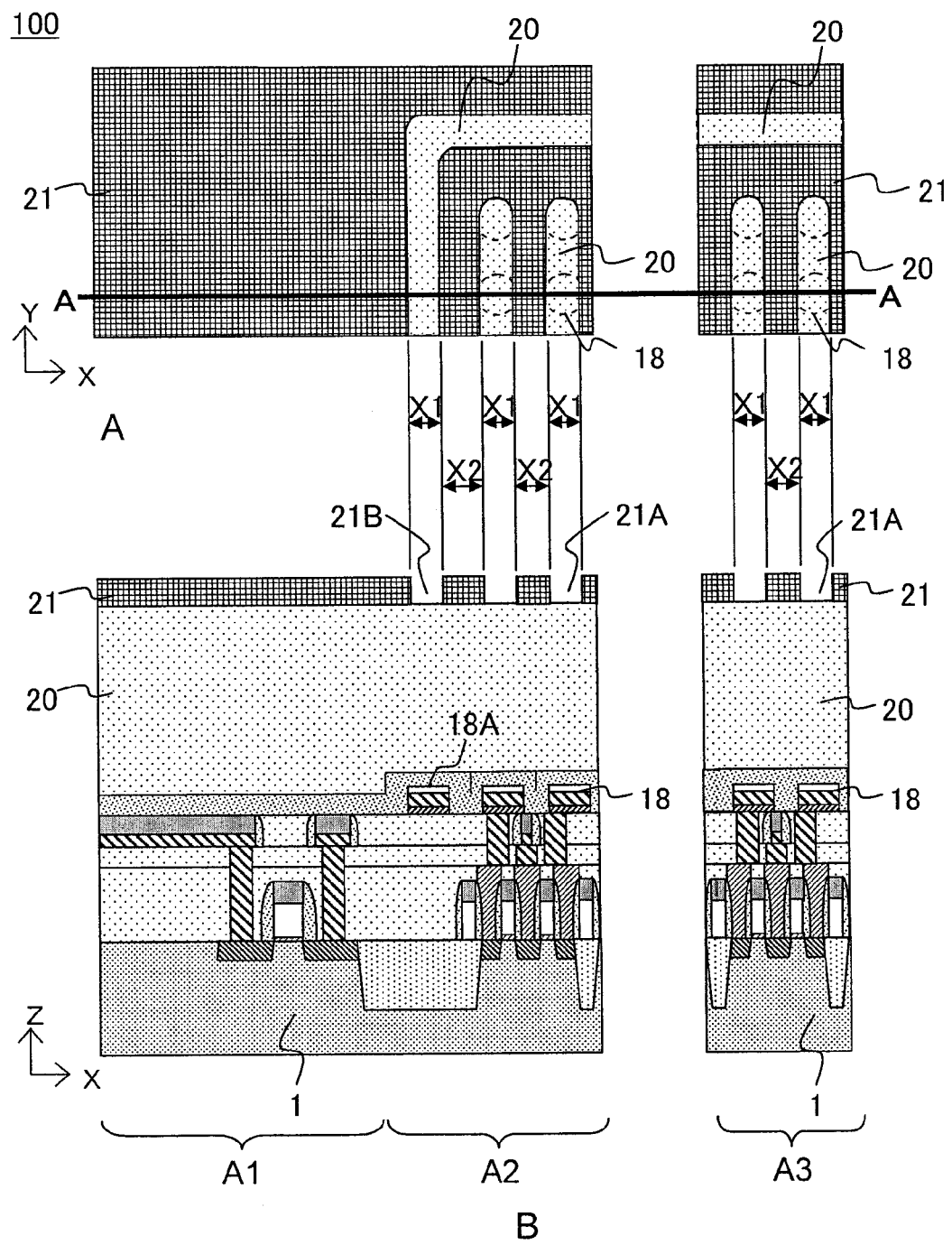
FIG. 6 illustrates a step of the method for manufacturing a semiconductor device according to the first exemplary embodiment.

As shown in FIG. 6, support film 21 that was a silicon nitride film of thickness 50 nm was deposited by the plasma CVD method so as to cover fourth interlayer insulating film 20. Then, groove-like openings 21A with width X1 of 70 nm were formed in support film 21 by photolithography and dry etching to expose parts of fourth interlayer insulating film 20. At this time, openings 21A extended in a Y direction and were arranged parallel to one another in an X direction so as to overlap fourth interlayer insulating film 20 on contact pad 18 as seen in a plan view at intervals X2 of 70 nm. In this case, opening 21A is shaped like a groove but may be shaped like a hole of diameter 70 nm. In addition, simultaneously with the formation of openings 21A, opening 21B with width X1 of 70 nm was formed. Opening 21B was arranged so as to overlap fourth interlayer insulating film 20 on dummy pad 18A as seen in a plan view and to surround openings 21A.

Figure 7:
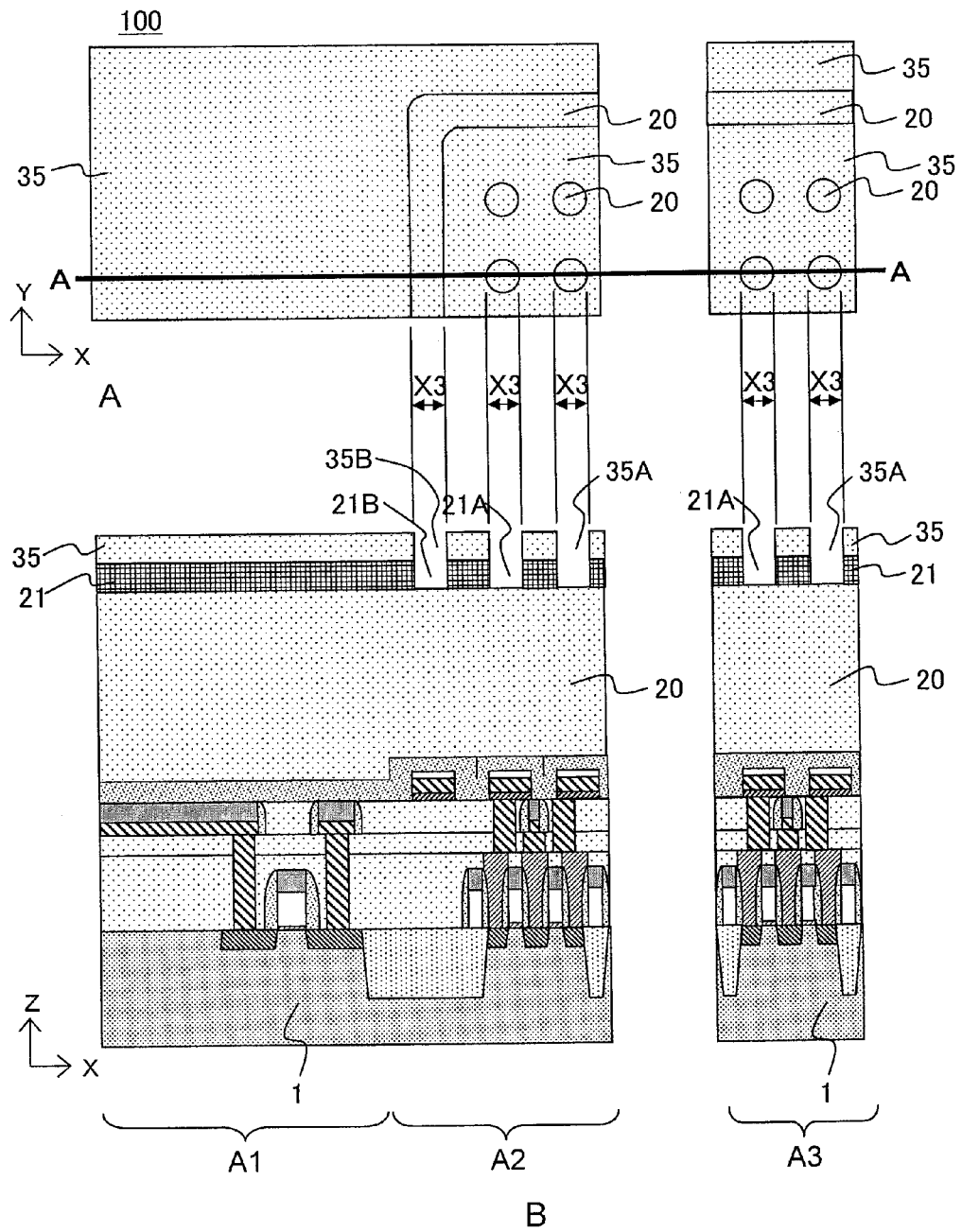
FIG. 7 illustrates a step of the method for manufacturing a semiconductor device according to the first exemplary embodiment.

As shown in FIG. 7, mask film 35 that was a silicon oxide film of thickness 100 nm was deposited by the plasma CVD method so as to bury openings 21A and 21B and to cover support film 21. Then, hole-like openings 35A each with diameter X3 of 70 nm was formed in mask film 35 by photolithography and dry etching. In this case, since openings 35A are positioned so as to overlap openings 21A as seen in a plan view, parts of fourth interlayer insulating film 20 exposed by openings 21A are exposed by openings 35A. In addition, simultaneously with the formation of openings 35A, opening 35B with width X3 of 70 nm was formed. Opening 35B is arranged so as to overlap at least a part of opening 21B as seen in a plan view and surrounds openings 35A.

Figure 8:
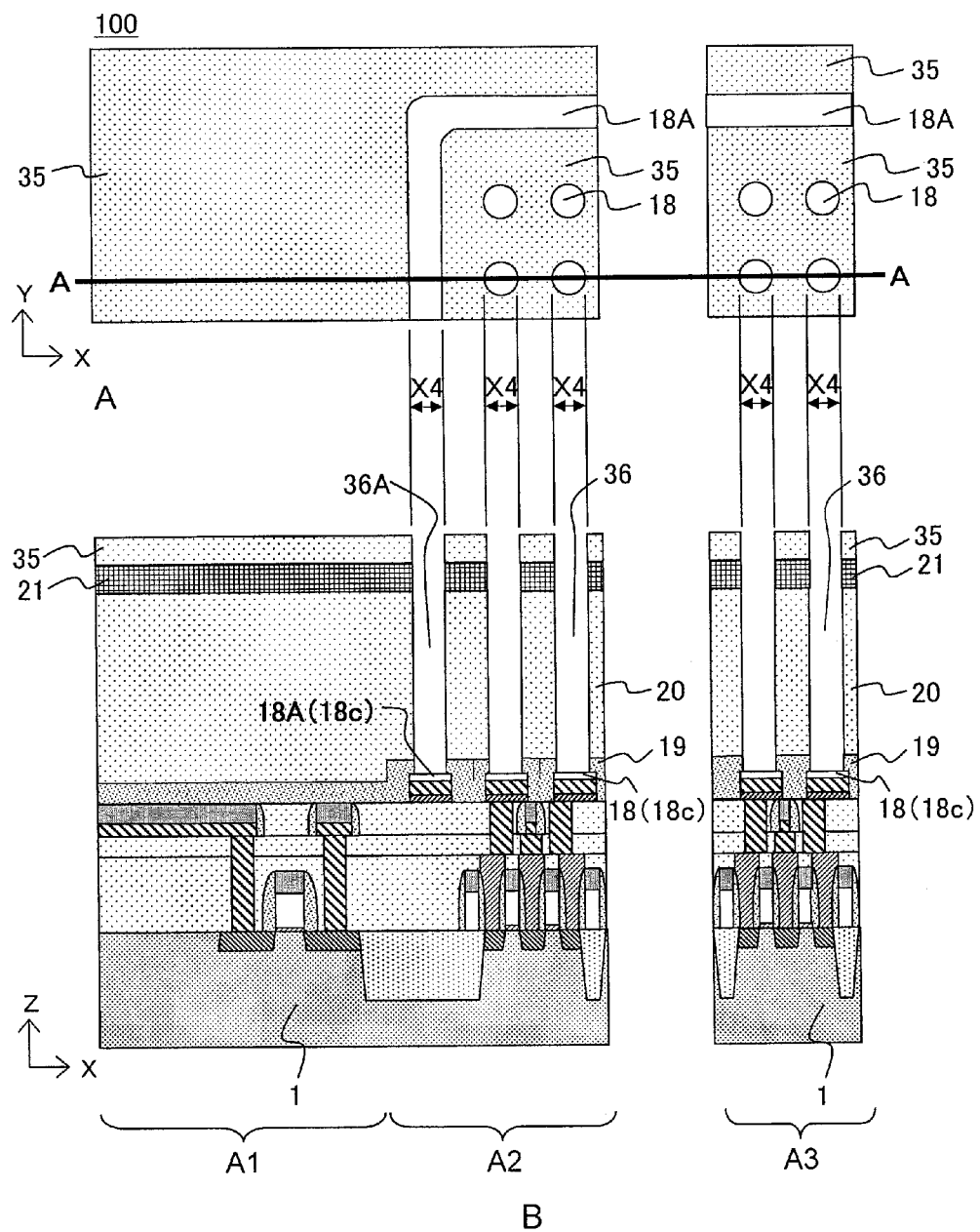
FIG. 8 illustrates a step of the method for manufacturing a semiconductor device according to the first exemplary embodiment.

As shown in FIG. 8, parts of fourth interlayer insulating film 20 which were exposed at the bottom of openings 35A were removed by dry etching using openings 21A and 35A as a mask. Thus, cylinder holes 36 were formed which passed through from mask film 35 through support film 21 to fourth interlayer insulating film 20. As a result of this dry etching, each cylinder hole 36 formed in fourth interlayer insulating film 20 has diameter X4 of 70 nm, which is the same as that of each opening 35A, thus exposing a part of cover film 19. Moreover, the dry etching is set to offer high selectivity so as to etch only the parts of fourth interlayer insulating film 20 exposed by openings 35A. Thus, mask film 35 and cover film 19 remain in the same state as that before the dry etching. Simultaneously with the formation of cylinder hole 36, dummy hole 36A with width X4 of 70 nm was formed by dry etching using openings 21B and 35B as a mask. Like cylinder holes 36, dummy hole 36A exposes a part of cover film 19.

Then, parts of cover film 19 each remaining on a bottom surface of corresponding cylinder hole 36 were removed by dry etching, to expose at least part of corresponding contact pad 18. In this case, dry etching conditions were as follows:

Trifluoromethane ($CHF_3$) and oxygen ($O_2$) were used as material gas, and the respective flow rates were set to 80 sccm ($CHF_3$) and 20 sccm ($O_2$). High frequency power, stage temperature, and pressure were set to 3,000 W, 20° C., and 30 mTorr, respectively.

This dry etching was set to offer high selectivity so as to etch only parts of cover film 19 exposed by cylinder holes 36. Thus, mask film 35 and contact pads 18 remained without being etched. As a result of the dry etching, a part of sacrifice film 18c included in contact pad 18 was exposed at the bottom surface of cylinder hole 36. Here, the surface of sacrifice film 18c formed of molybdenum was exposed to oxygen ($O_2$) forming the material gas for the dry etching. However, an oxide such as molybdenum dioxide was not formed. This is because molybdenum has the property of avoiding reacting with oxygen ($O_2$) at room temperature. This also applies to tungsten (W) forming first conductive film 18b. Simultaneously with the removal of parts of cover film 19 which remain on the bottom surfaces of respective cylinder holes 36, a part of cover film 19 which remained on a bottom surface of dummy hole 36A was removed to expose at least a part of dummy pad 18A.

Figure 9:
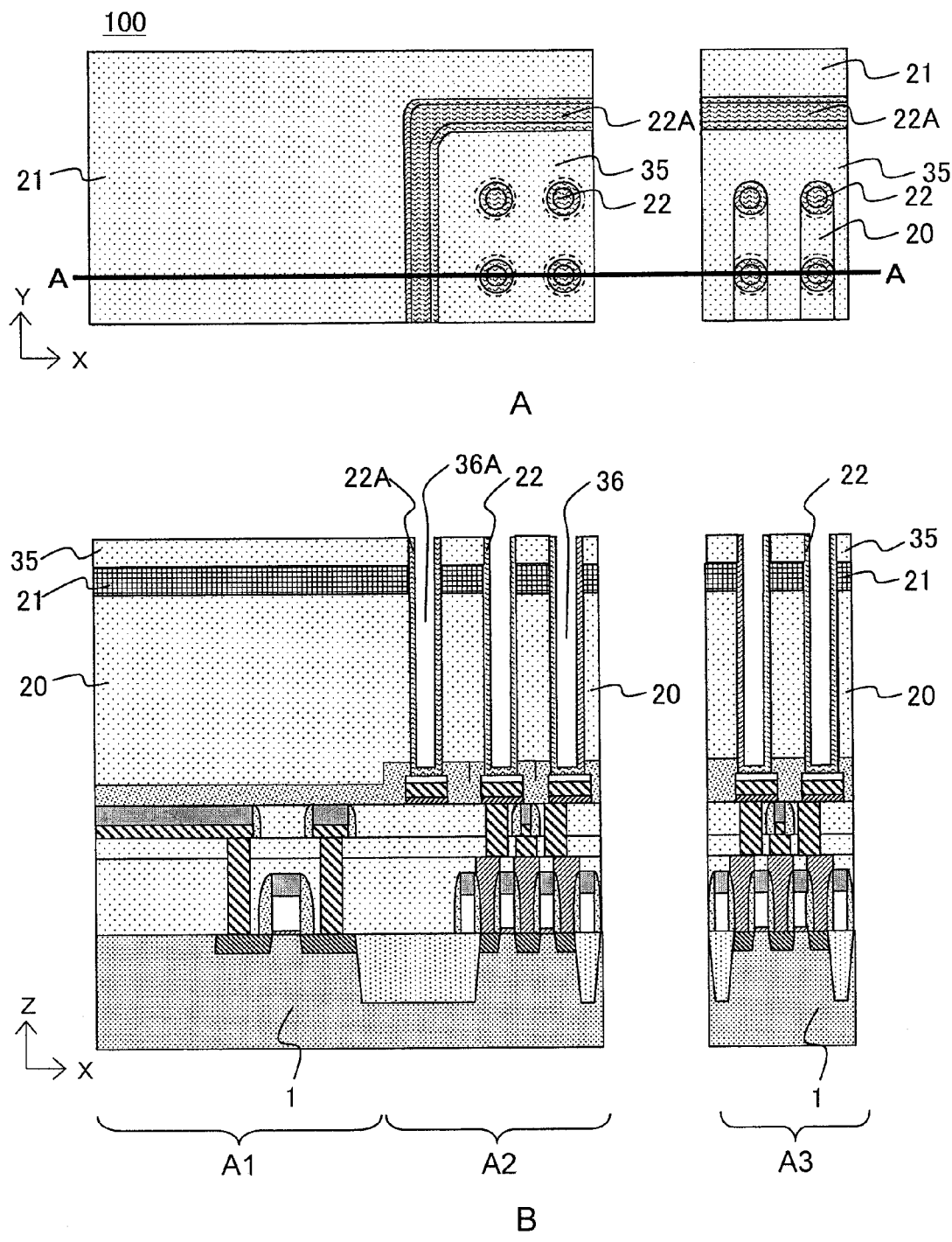
FIG. 9 illustrates a step of the method for manufacturing a semiconductor device according to the first exemplary embodiment.

As shown in FIG. 9, lower electrode 22 that was molybdenum dioxide ($MoO_2$) of thickness 10 nm was formed by the ALD (Atomic Layer Deposition) method so as to cover an inner wall of cylinder hole 36. Simultaneously with the formation of lower electrode 22, dummy electrode 22A that was molybdenum dioxide ($MoO_2$) of thickness 10 nm was formed by the ALD method so as to cover an inner wall of dummy hole 36A. According to the ALD method, a cycle was repeatedly carried out a plurality of times to deposit the relevant film on the silicon substrate maintained at a predetermined temperature. The cycle includes:

(1) Supplying material gas and adsorbing the material on the exposed surface (body in which a film is to be deposited; sacrifice film 18c) of contact pad 18,
(2) discharging a non-adsorbed portion of the material gas by vacuum purging,
(3) supplying oxidizing gas to oxidize the adsorbed material, and
(4) discharging an excess portion of the oxidizing gas by vacuum purging.

Here, step (1) was carried out for 45 seconds under the following process conditions for one cycle:

TEMAM (Tetrakis Ethyl Methyl Amide Molybdenum: $Mo[N(CH_3)CH_2CH_3]_4$) was used as material gas, and for the material gas, flow rate, temperature, and pressure were set to 100 sccm, 130° C., and 0.8 Torr, respectively.

step (3) was carried out for 15 seconds under the following conditions:

Ozone ($O_3$) was used as oxidizing gas, and for the oxidizing gas, flow rate, temperature, and pressure were set to 800 sccm, 130° C., and 0.8 Torr, respectively.

These process conditions allow lower electrode 22 of thickness 0.3 nm to be formed per cycle, and thus 33 cycles of treatment were carried out to achieve a thickness of 10 nm. A part of lower electrode 22 also covered a top surface of mask film 35, and thus the part of lower electrode 22 on mask film 35 was removed by CMP. In addition, in view of the deposition speed of molybdenum dioxide ($MoO_2$), cycle formed of steps (1) to (4) are preferably carried out at 150° C. to 300° C.

Figure 10:
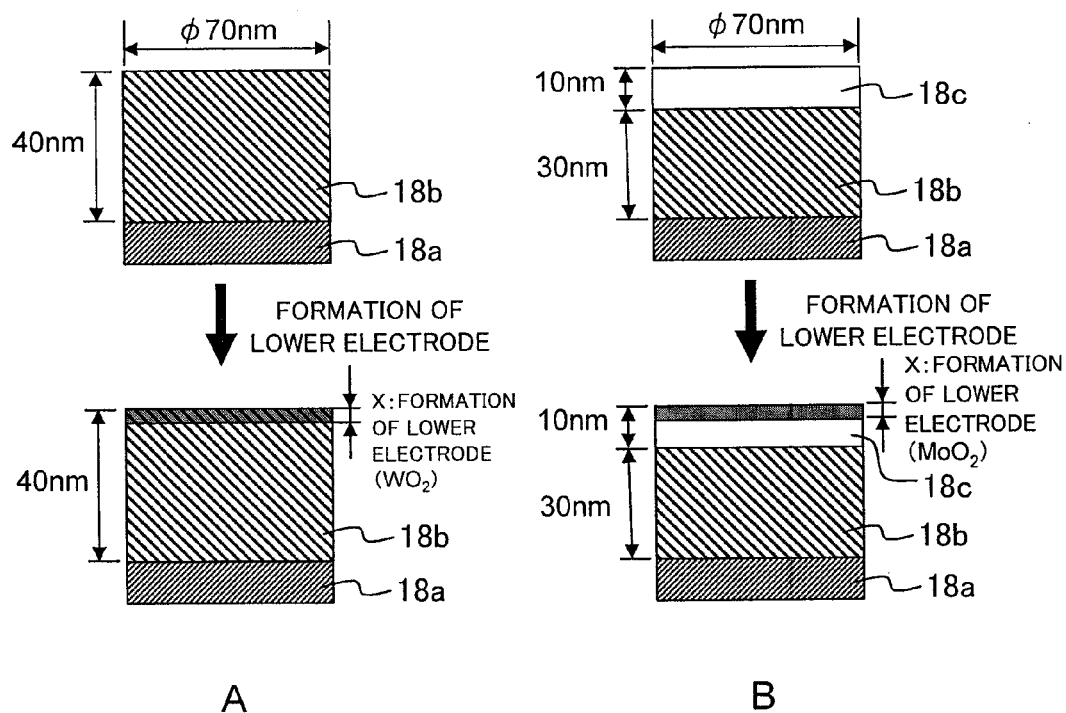
FIG. 10 illustrates the state of a pad during formation of a lower electrode in the first exemplary embodiment and in a conventional example.

The ALD method uses ozone ($O_3$), which has higher oxidizability than oxygen ($O_2$), to oxidize the material at high temperature (for example, 150° C. to 300° C.). Thus, the surface of contact pad 18, which is not oxidized by oxygen, is oxidized. FIG. 10 includes different cross-sectional views showing how first conductive film 18b and sacrifice film 18c forming contact pad 18 are oxidized with ozone. In addition, the oxidation of first conductive film 18b does not occur in the present exemplary embodiment but is shown to clarify differences from the conventional technique. According to the present exemplary embodiment, sacrifice film 18c is exposed at the bottom portion of cylinder hole 36 when lower electrode 22 is formed, whereas according to the conventional technique, first conductive film 18b is exposed at the bottom portion of cylinder hole 36 when lower electrode 22 is formed. Thus, the manner in which the surface of contact pad 18 is oxidized varies between the present exemplary embodiment and the conventional technique. More specifically, as shown in FIG. 10, according to the present exemplary embodiment, molybdenum dioxide ($MoO_2$) (an oxide film of the second metal) is formed on the surface of sacrifice film 18c as a result of oxidation of molybdenum (Mo) (second metal) forming sacrifice film 18c. On the other hand, according to the conventional technique, tungsten dioxide ($WO_2$) (an oxide film of the first metal) is formed on the surface of first conductive film 18b as a result of oxidation of tungsten (W) (first metal) forming first conductive film 18b. In the actual structure according to the present exemplary embodiment, the molybdenum dioxide ($MoO_2$) formed on the surface of sacrifice film 18c is the same as the molybdenum dioxide ($MoO_2$) formed into the lower electrode. Hence, the boundary between these layers of molybdenum dioxide ($MoO_2$) may not be clearly determined. However, a top surface of the contact pad normally has a cross-sectional shape different from that of a bottom surface of the lower electrode, and thus a discontinuous portion of the cross-sectional shape may be identified as the boundary between the contact pad and the lower electrode.

Figure 11:
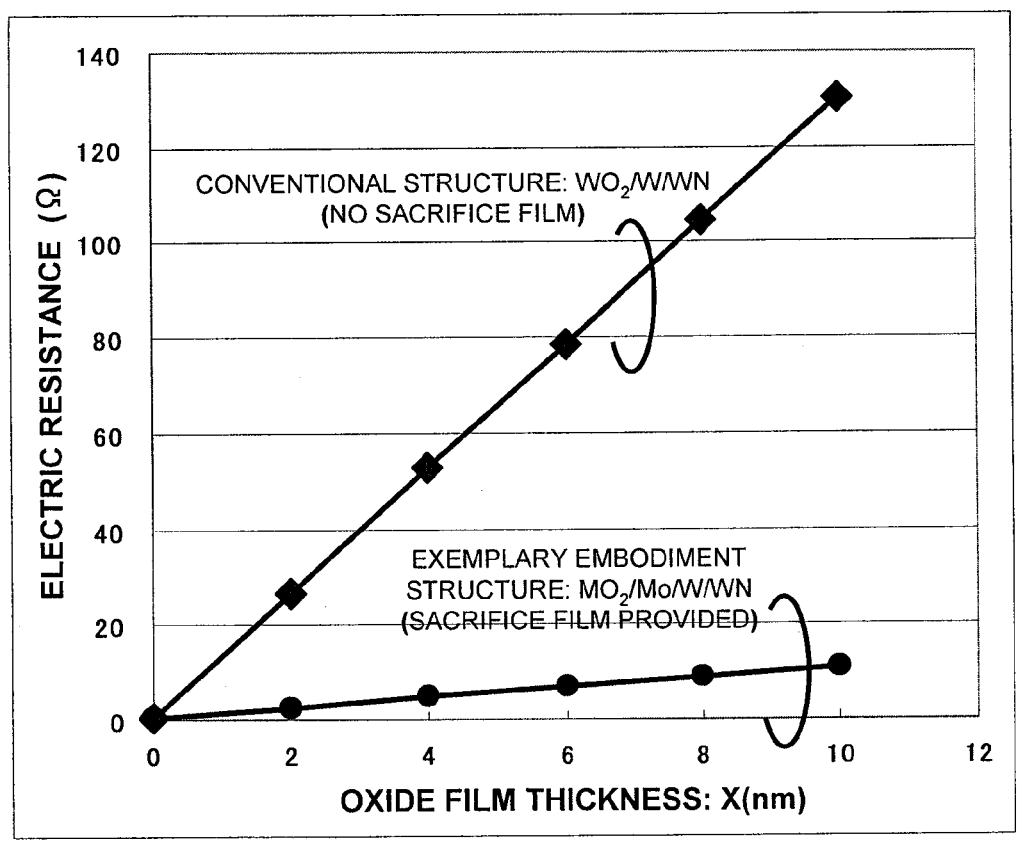
FIG. 11 illustrates the relationship between an oxide film thickness and an electric resistivity in a pad according to the first exemplary embodiment and in a pad according to the conventional example.

FIG. 11 shows the electric resistance of the structure containing molybdenum dioxide (the oxide film of the second metal) and of the structure containing tungsten dioxide (the oxide film of the first metal). Here, FIG. 10A shows first conductive film 18b of diameter 70 nm and thickness 40 nm as a conventional structure. Furthermore, in the structure according to the exemplary embodiment shown in FIG. 10B, first conductive film 18b is set to 30 nm in thickness so as to set the total film thickness of first conductive film 18b of diameter 70 nm and sacrifice film 18c to 40 nm. Thus, the electric resistance in FIG. 11 is based on the film thickness and bottom area shown in FIG. 10. In addition, the thicknesses of first conductive film 18b and sacrifice film 18c, from which the oxide is obtained, decrease with increasing oxide film thickness. The electric resistance in FIG. 11 is shown with such a structural variation taken into account. As shown in FIG. 11, at any oxide film thickness, the electric resistance of the contact pad in the exemplary embodiment structure containing molybdenum dioxide is lower than that of the contact pad in the conventional structure containing tungsten dioxide. The reason why the electric resistance shows such a characteristic is that molybdenum dioxide (the oxide film of the second metal) has an electric resistivity of 400 μΩ·cm, whereas tungsten dioxide (the oxide film of the first metal) has an electric resistivity of 5,000 μΩ·cm; the electric resistivity of molybdenum dioxide accounts for only 8% of the electric resistivity of tungsten dioxide. An oxide can also be obtained even if metal such as cobalt (Co), ruthenium (Ru), chromium (Cr), or manganese (Mn) is used for sacrifice film 18c instead of molybdenum. Oxides of these metals have a lower electric resistivity than tungsten dioxide (the oxide film of the first metal) and thus serve to exert effects similar to those of molybdenum.

The oxide film of the second metal preferably has an electric resistivity of 1,000 μΩ·cm or less. Such an electric resistivity enables a reduction in the resistance of contact pad 18. That is, the second metal serving as a material for sacrifice film 18c is selected such that the oxide film of the second metal has a lower electric resistivity than the oxide film of the first metal obtained by oxidizing the first metal serving as a material for first conductive film 18b. The effects of the present invention can be exerted if for example, sacrifice film 18c contains, as the second metal, at least one type of metal selected from a group consisting of molybdenum (Mo), cobalt (Co), ruthenium (Ru), chromium (Cr), and manganese (Mn). If molybdenum (Mo), cobalt (Co), ruthenium (Ru), chromium (Cr), or manganese (Mn) is used as the second metal, molybdenum dioxide ($MoO_2$), cobalt dioxide ($CoO_2$), ruthenium dioxide ($RuO_2$), chromium dioxide ($CrO_2$), or manganese dioxide ($MnO_2$), respectively, is formed on the surface of sacrifice film 18c after the lower electrode is formed.

In the above-described example, second conductive film 18c is 10 nm in film thickness before lower electrode 22 is formed. However, the film thickness of second conductive film 18c is not limited to this range but may be 2 nm to 20 nm. When the film thickness of second conductive film 18c falls within these ranges, the oxide film of the second metal may have a predetermined range of film thickness after the lower electrode is formed, thereby enabling an effective reduction in the resistance of the contact pad. The oxide film of the second metal preferably has a film thickness of 1 nm to 5 nm after lower electrode 22 is formed.

Furthermore, after lower electrode 22 is formed, the second conductive film may remain or second conductive film 18c may wholly be converted into an oxide film of the second metal. If second conductive film 18c remains after lower electrode 22 is formed, when second conductive film 18c has a higher electric resistivity than first conductive film 18b, the electric resistivity of the contact pad as a whole increases by the difference in electric resistivity. However, since both first and second conductive films 18b and 18c are conductive, there is not a great difference between these films in electric resistivity. In contrast, as described above, the oxide film of the second metal has a significantly lower electric resistivity than the oxide film of the first metal. Thus, even if an increase in the electric resistivity of second conductive film 18c with respect to first conductive film 18b is taken into account, since the electric resistivity of the oxide film of the second metal decreases with respect to the oxide film of the first metal, the electric resistivity of the pad as a whole decreases. Thus, the effects of the present invention can be exerted even if second conductive film 18c has a higher electric resistivity than first conductive film 18b. However, to allow a further reduction in the electric resistivity of the pad as a whole, the material of second conductive film 18c is preferably selected to achieve a lower electric resistivity than first conductive film 18b.

If second conductive film 18c remains after lower electrode 22 is formed, the film thickness ratio between second conductive film 18c and the oxide film of the second metal is preferably such that (the film thickness of the second conductive film):(the film thickness of the oxide film of the second metal)=20:1 to 2:1.

Figure 12:
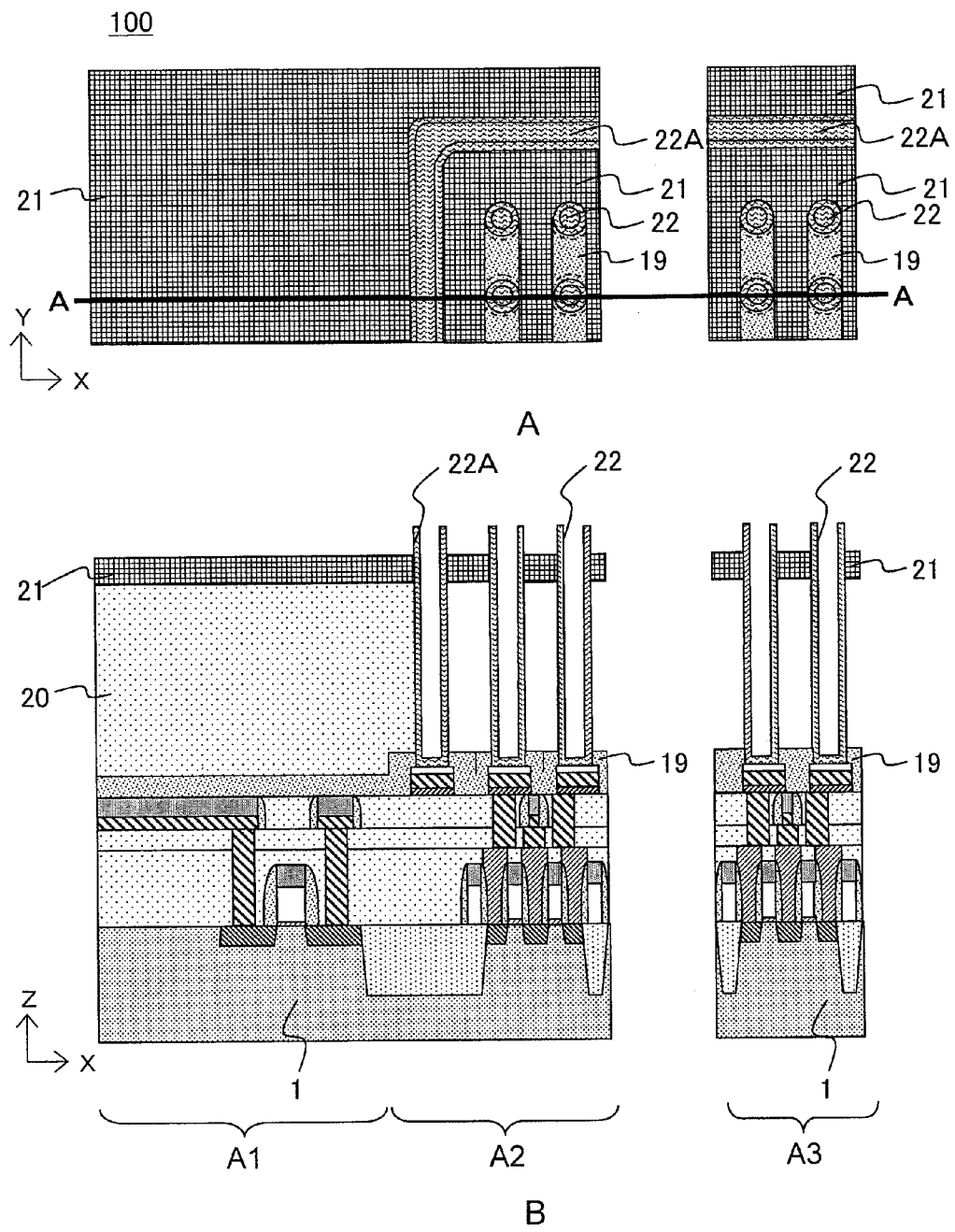
FIG. 12 illustrates a step of the method for manufacturing a semiconductor device according to the first exemplary embodiment.

As shown in FIG. 12, mask film 35, formed of a silicon oxide film, and a part of fourth interlayer insulating film 20 which was located in the memory cell region were removed by wet etching using hydrofluoric acid (HF) to expose the side surface portion of lower electrode 22. The wet etching is isotropic and thus allows the removal not only of parts of fourth interlayer insulating film 20 which are exposed from openings 21A appearing after the removal of mask film 35 but also of a part of fourth interlayer insulating film 20 which is located under support film 21. At this time, a part of fourth interlayer insulating film 20 which is located in the peripheral circuit region remains without being etched because this part is entirely covered with support film 21 and dummy electrode 22A, which are not removed by hydrofluoric acid. Parts of cover film 19 which are newly exposed by the removal of the part of fourth interlayer insulating film 20 which is located in the memory cell region, are also not removed by hydrofluoric acid and thus remain in the same state as that before the wet etching.

As shown in FIG. 13, capacitive insulating film 23 was formed by the CVD method or the ALD method so as to cover the surface of lower electrode 22 with the side surface thereof exposed. Thereafter, upper electrode 24 that was molybdenum dioxide was deposited by the ALD method so as to further cover the surface of capacitive insulating film 23. Lower electrode 22 and upper electrode 24 thus arranged opposite to each other via capacitive insulating film 23 function as a capacitor. Capacitive insulating film 23 may be a high-dielectric-constant film such as titanium oxide ($TiO_2$), zirconium oxide ($ZrO_2$), aluminum oxide ($Al_2O_3$), or hafnium oxide ($HfO_2$), or a film stack thereof. Furthermore, upper electrode 24 may have a stack structure obtained by forming molybdenum dioxide of thickness about 10 nm, stacking a polysilicon film with impurities doped therein on the molybdenum dioxide to fill a cavity portion between adjacent lower electrodes 22, and further depositing tungsten (W) on the polysilicon film to a thickness of about 100 nm. Additionally, the upper electrode may be at least one type of oxide film selected from a group consisting of molybdenum dioxide ($MoO_2$), manganese dioxide ($MnO_2$), chromium dioxide ($CrO_2$), cobalt dioxide ($CoO_2$), and ruthenium dioxide ($RuO_2$), or a metal film such as ruthenium (Ru) or platinum (Pt).

Then, unwanted films (upper electrode 24, capacitive insulating film 23, and support film 21) on the peripheral circuit region were removed by dry etching using a photoresist film (not shown in the drawings) as a mask to form capacitor 25. Removal of support film 21 from the peripheral circuit region allows easy formation of deep contact plugs penetrating through the part of fourth interlayer insulating film 20 which is located in the peripheral circuit region.

Then, a top surface of upper electrode 24 is covered with fifth interlayer insulating film 26 formed of a silicon oxide film or the like. Fifth interlayer insulating film 26 is flattened by CMP. Then, fourth contact plug 27 and second wiring 28 are formed which served to provide a predetermined potential to upper electrode 24. Semiconductor device 100 as a DRAM shown in FIG. 2 is completed by subsequent formation of a surface protection film and the like.

As described above, in semiconductor device 100 according to the present exemplary embodiment, contact pad (conductor film) 18 is formed by forming sacrifice film 18c on first conductive film 18b. With the thus formed contact pad, even if the surface of contact pad 18 is oxidized by ozone when lower electrode 22 is formed, only sacrifice film 18c the oxide of which has a low electric resistivity is oxidized. This prevents oxidation of first conductive film 18b the oxide of which has a high electric resistivity. Such an oxidation prevention effect of first conductive film 18b suppresses an increase in the electric resistivity of contact pad 18 to reduce the malfunction rate of semiconductor device 100. This enables an increase in yield.

Furthermore, as described in FIG. 10 and FIG. 11, the material of sacrifice film 18c is selected such that the oxide film formed on the surface of sacrifice film 18c has a lower electric resistivity than the oxide film formed on the surface of first conductive film 18b. Moreover, second conductive film 18c preferably has a lower electric resistivity than first conductive film 18b. Thus, when second conductive film 18c and the oxide film of the second metal each have a lower electric resistivity than the corresponding one of first conductive film 18b and the oxide film of the first metal, the electric resistivity of the whole pad including first conductive film 18b, second conductive film 18c, and the oxide film of the second metal according to the present embodiment can be set lower than that of a pad with first conductive film 18b and the oxide film of the first metal.

The exemplary embodiment has been described. However, the present invention is not limited to the exemplary embodiment. Various changes may be made to the exemplary embodiment without departing from the scope of the present invention, and the resulting embodiments are of course included within the scope of the present invention.

It is apparent that the present invention is not limited to the above embodiments, but may be modified and changed without departing from the scope and spirit of the invention.

Moreover, the scope of the present invention includes the following manufacturing methods.

1. A method for manufacturing a semiconductor device, comprising:
forming a conductor including a first conductive film containing a first metal, a second conductive film containing a second metal on the first conductive film, and an oxide film of the second metal on the second conductive film; and
forming a lower electrode of a capacitor on the conductor,
wherein the oxide film of the second metal has a lower electric resistivity than an oxide film of the first metal.

2. The method for manufacturing a semiconductor device according to the above 1,
wherein the lower electrode of the capacitor is formed by an ALD method.

3. The method for manufacturing a semiconductor device according to the above 2,
wherein in the ALD method, a cycle formed of the following steps (1)-(4) is performed one or more times:
(1) supplying material gas to adsorb a material on an exposed surface of the conductor;
(2) purging the material gas;
(3) supplying oxidizing gas to oxidize the adsorbed material; and
(4) purging the oxidizing gas.

4. The method for manufacturing a semiconductor device according to the above 3,
wherein the oxidizing gas is ozone ($O_3$) gas.

5. The method for manufacturing a semiconductor device according to the above 1,
wherein the second metal is at least one type of metal selected from the group consisting of molybdenum (Mo), cobalt (Co), ruthenium (Ru), chromium (Cr), and manganese (Mn).

6. The method for manufacturing a semiconductor device according to the above 1,
wherein the first metal is tungsten.

7. The method for manufacturing a semiconductor device according to the above 1,
wherein in forming the conductor, the oxide film of the second metal having the electric resistivity of 1,000 µΩ·cm or less is formed.

8. The method for manufacturing a semiconductor device according to the above 1,
wherein in forming the lower electrode of the capacitor, the lower electrode is formed which contains at least one type of oxide film selected from the group consisting of molybdenum dioxide ($MoO_2$), manganese dioxide ($MnO_2$), chromium dioxide ($CrO_2$), cobalt dioxide ($CoO_2$), and ruthenium dioxide ($RuO_2$).

9. The method for manufacturing a semiconductor device according to the above 1, further comprising, after forming the lower electrode of the capacitor, forming a capacitive insulating film of the capacitor on the lower electrode.

10. The method for manufacturing a semiconductor device according to the above 9,
wherein in forming the capacitive insulating film, the capacitive insulating film containing titanium dioxide is formed.

11. The method for manufacturing a semiconductor device according to the above 9, further comprising, after forming the capacitive insulating film, forming an upper electrode containing at least one type of oxide film selected from the group consisting of molybdenum dioxide ($MoO_2$), manganese dioxide ($MnO_2$), chromium dioxide ($CrO_2$), cobalt dioxide ($CoO_2$), and ruthenium dioxide ($RuO_2$), on the capacitive insulating film.

What is claimed is:

1. A semiconductor device comprising:
   a conductor which includes a first conductive film containing a first metal, a second conductive film containing a second metal on the first conductive film, and an oxide film of the second metal on the second conductive film; and
   a capacitor comprising a lower electrode provided on the conductor,
   wherein the first conductive film and the second conductive film are configured such that the oxide film of the second metal has a lower electric resistivity than an oxide film of the first metal would have, if the first conductive film were oxidized to form an oxide film of the first metal.

2. The semiconductor device according to claim 1, wherein the second metal is at least one type of metal selected from the group consisting of molybdenum (Mo), cobalt (Co), ruthenium (Ru), chromium (Cr), and manganese (Mn).

3. The semiconductor device according to claim 1, wherein the first metal is tungsten.

4. The semiconductor device according to claim 1, wherein the oxide film of the second metal has the electric resistivity of 1,000 $\mu\Omega \cdot cm$ or less.

5. The semiconductor device according to claim 1, wherein the lower electrode contains at least one type of oxide film selected from the group consisting of molybdenum dioxide ($MoO_2$), manganese dioxide ($MnO_2$), chromium dioxide ($CrO_2$), cobalt dioxide ($CoO_2$), and ruthenium dioxide ($RuO_2$).

6. The semiconductor device according to claim 1, wherein the capacitor comprises a capacitive insulating film formed on the lower electrode.

7. The semiconductor device according to claim 6, wherein the capacitive insulating film contains titanium dioxide.

8. The semiconductor device according to claim 6, wherein the capacitor includes an upper electrode formed on the capacitive insulating film, the upper electrode containing at least one type of oxide film selected from the group consisting of molybdenum dioxide ($MoO_2$), manganese dioxide ($MnO_2$), chromium dioxide ($CrO_2$), cobalt dioxide ($CoO_2$), and ruthenium dioxide ($RuO_2$).

9. The semiconductor device according to claim 8, further comprising: a contact plug connected to the conductor; and a transistor including a diffusion layer connected to the contact plug.

10. The semiconductor device according to claim 1, wherein the second conductive film has a film thickness of 2 nm or more and 20 nm or less.

11. The semiconductor device according to claim 1, wherein the oxide film of the second metal has a film thickness of 1 nm or more and 5 nm or less.

12. The semiconductor device according to claim 1, further comprising a diffusion preventing film under the first conductive film.

13. The semiconductor device according to claim 12, wherein the diffusion preventing film contains tungsten nitride.

14. A semiconductor device comprising:
   a first conductive film containing a first metal;
   a second conductive film containing a second metal on the first conductive film;
   an oxide film of the second metal on a surface of the second conductive film; and
   a third conductive film on the oxide film of the second metal,
   wherein the first conductive film and the second conductive film are configured such that the oxide film of the second metal has a lower electric resistivity than an oxide film of the first metal would have, if the first conductive film were oxidized to form an oxide film of the first metal.

15. The semiconductor device according to claim 14, wherein the first metal is tungsten.

16. The semiconductor device according to claim 14, wherein the second metal is at least one type of metal selected from the group consisting of molybdenum (Mo), cobalt (Co), ruthenium (Ru), chromium (Cr), and manganese (Mn).

17. The semiconductor device according to claim 14, wherein the oxide film of the second metal has the electric resistivity of 1,000 $\mu\Omega \cdot cm$ or less.

18. The semiconductor device according to claim 14, wherein the second conductive film has a film thickness of 2 nm or more and 20 nm or less.

19. The semiconductor device according to claim 14, wherein the oxide film of the second metal has a film thickness of 1 nm or more and 5 nm or less.

20. The semiconductor device according to claim 14, further comprising a diffusion preventing film under the first conductive film.

* * * * *